United States Patent [19]

Harwell

[11] 4,157,541

[45] Jun. 5, 1979

[54] DEVICE FOR DETECTING CABLE INSULATION FAULTS

[75] Inventor: Herman R. Harwell, Fort Worth, Tex.

[73] Assignee: Malor Mfg. Inc., Fort Worth, Tex.

[21] Appl. No.: 845,477

[22] Filed: Oct. 26, 1977

[51] Int. Cl.² ............................................. G08B 21/00
[52] U.S. Cl. .................................... 340/540; 340/510; 340/650; 324/54; 37/193
[58] Field of Search ............... 340/500, 540, 510, 650; 324/54, 52, 51; 37/193

[56] References Cited

U.S. PATENT DOCUMENTS

| 2,942,181 | 6/1960 | Edwards et al. | 324/54 |
| 3,160,871 | 12/1964 | Rubinstein | 340/650 |
| 3,648,282 | 3/1972 | Kelly | 340/421 |

*Primary Examiner*—Alvin H. Waring
*Attorney, Agent, or Firm*—Wofford, Fails and Zobal

[57] ABSTRACT

A device for detecting cable insulation faults while laying underground cables. The device is adapted for attachment to the cable reel, having one lead connected to the metal shield of the cable or to selected conductors and the other lead to the metal reel. A bridge circuit within the device applies a voltage potential between the two leads, with the resulting resistance value serving as one leg of the bridge circuit. Two high impedance amplifiers are connected across the bridge circuit to act as buffers between the bridge and the operational circuitry. A differential amplifier is connected to the outputs of the two high impedance amplifiers to provide an output proportional to the difference between the two high impedance amplifiers. This differential amplifier's output is adjusted to provide an alarm trigger signal when its two inputs differ by a predetermined amount. Preferably the alarm signal is transmitted to a remote location for providing the alarm.

8 Claims, 3 Drawing Figures

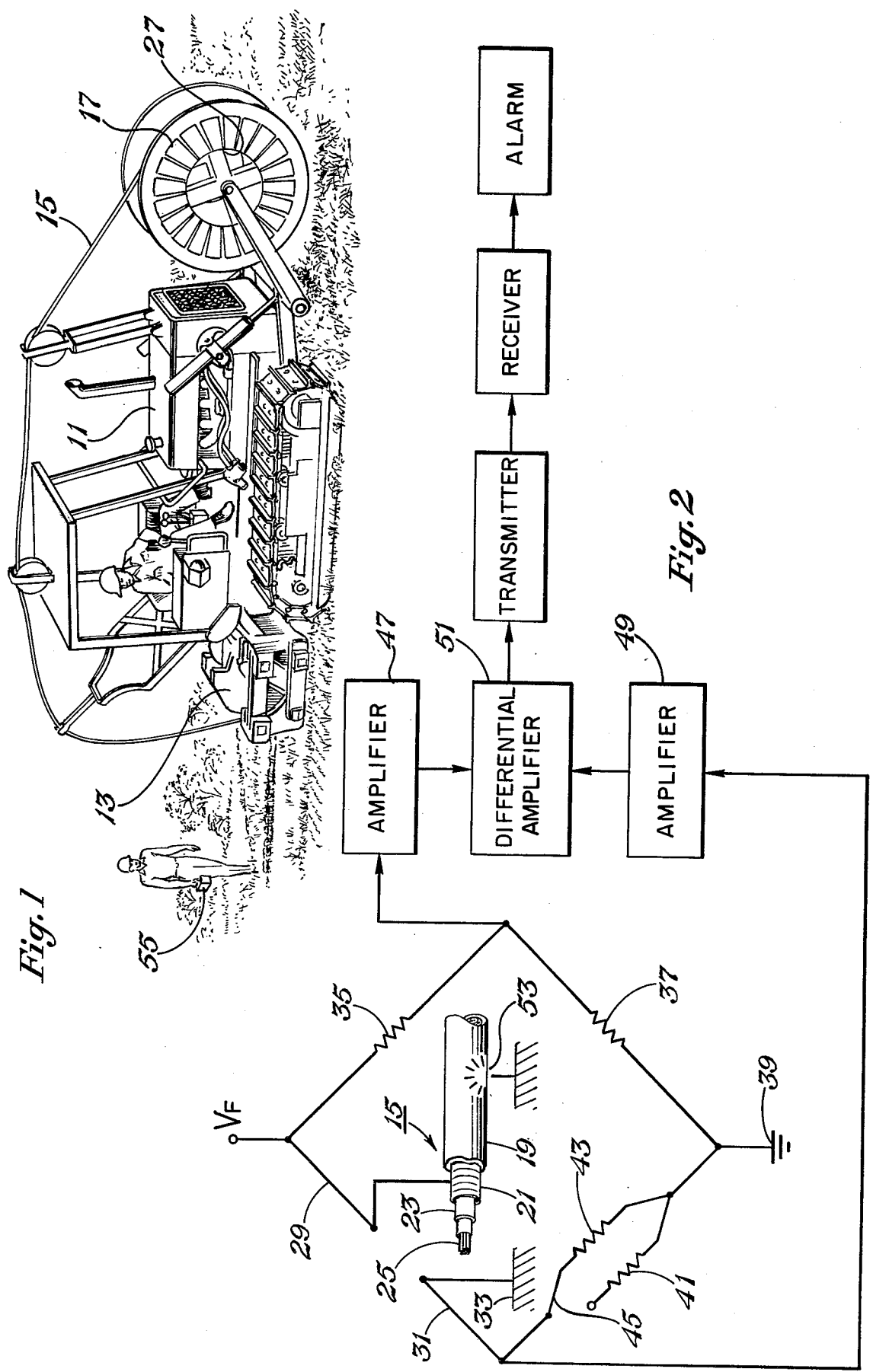

4,157,541

DEVICE FOR DETECTING CABLE INSULATION FAULTS

BACKGROUND OF THE INVENTION

1. Field of the Invention

This invention relates to devices for detecting faults in cable insulation, and in particular to an electronic device for detecting a fault and providing an alarm signal while laying underground cable.

2. Description of the Prior Art

Telephone and other types of insulating cable are often buried underground by a machine that simultaneously plows a trench and feeds the cable from the reel into the trench. Should the insulation of the cable be cut or punctured by the plow or rocks, it will later have to be dug up and repaired. Normally the cable is not tested for defective insulation until after it has been completely buried. Finding the precise location of the fault in a cable of substantial length can be difficult.

An apparatus is disclosed in U.S. Pat. No. 3,648,282 for detecting insulation faults as the cable is being buried. An electrical potential is attached between the metal shield of the cable and ground. If a fault occurs, the resulting current flowing to ground passes through a relay, which in turn closes contacts to sound an alarm.

The design has inherent disadvantages. A highly sensitive relay is required, since current flow may be small. Relays can be troublesome, especially when used with vibrating heavy equipment operated outdoors. Also, it appears that the sensitivity of the circuit would have to be adjusted for varying earth moisture conditions to assure that a fault would be detected. In addition, the detector is mounted on the tractor, with a collector being used to provide communication between the end of the cable and the circuitry. Changeover to a new reel would be more difficult than with conventional reels because of the collector.

SUMMARY OF THE INVENTION

It is accordingly a general object of this invention to provide an improved device for detecting insulation faults in cable as it is being laid.

It is a further object of this invention to provide an improved fault detecting device that does not require relays.

It is a further object of this invention to provide an improved fault detecting device that does not require a collector, nor sensitivity adjustments for varying moisture conditions.

In accordance with these objects, a device is provided that uses a bridge circuit to detect if the resistance of the cable to the earth drops below a selected minimum. A constant electrical potential is placed between the end of the cable and ground, with this resistance being the unknown resistance in a four-leg bridge circuit. Amplifiers are connected to opposite junctions of the bridge circuit, with the input of one of them connected to the constant value electrical potential. The input to the other amplifier will be essentially zero if the resistance from cable to ground approaches infinity. The output of these two amplifiers are the inputs to a differential amplifier whose output is proportional to the difference between its two inputs. When the inputs differ by a predetermined amount an alarm signal is generated. The detection circuit is located on the reel, and the alarm is preferably located at a remote location. The detection circuit includes a transmitter to activate the alarm.

BRIEF DESCRIPTION OF THE DRAWINGS

FIG. 1 is a perspective view of a cable laying machine that is one of many types for using a fault detector of the type disclosed herein.

FIG. 2 is a schematic and block diagram illustrating the principles of the fault detector of this invention.

DESCRIPTION OF THE PREFERRED EMBODIMENT

Figure 3:
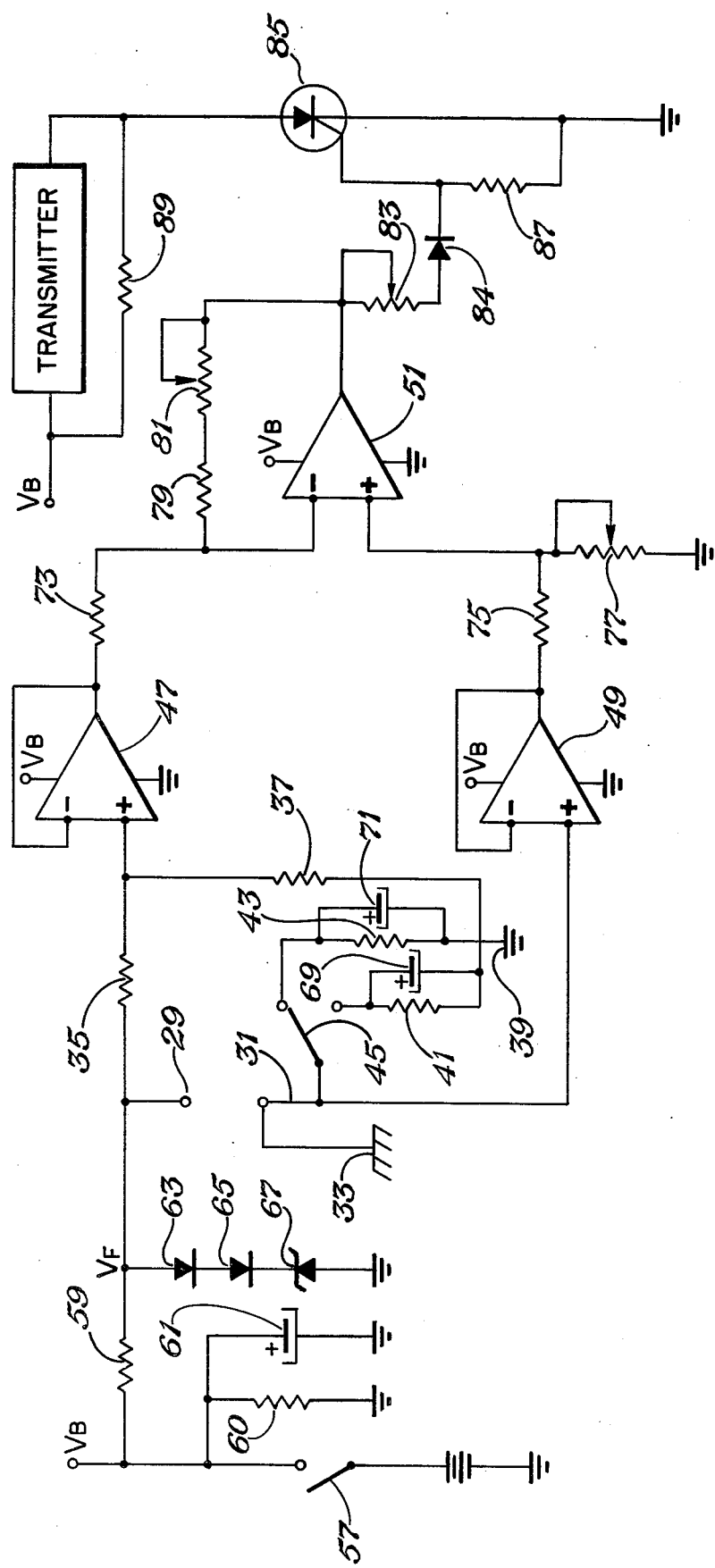
FIG. 3 is an electrical schematic diagram of the detection circuit of the fault detector of this invention.

Cable laying machinery for which this invention is to be used is shown in FIG. 1. The machinery includes a tractor 11, having a plow 13 for plowing a narrow trench. Cable 15 is wound around a metal reel 17, which is mounted to the front of the tractor 11. The cable 15 is restrained at one end and pulled off the reel 17 and laid in the trench as the tractor moves forward.

Cable 15 has an outer insulation layer 19, a metal shield 21 located next to the insulation layer 19, one or more inner insulation layers 23 inside the shield 21, and a plurality of conductors 25 inside the insulation layers 23. Conductors 25 are also insulated. When laying the cable, the beginning end of the cable 15 is protected so that shield 21 is not in contact with the earth or any grounded metal. Unless the shield 21 comes into contact with the earth through damaged insulation 19, the resistance between it and ground will be very high, approaching infinity.

To detect if the insulation is damaged, a detecting circuit is mounted in a box and attached to the end of the cable inside the reel 17 in the vicinity indicated by numeral 27. The detecting circuit is insulated from its housing or box, and contains a battery and two leads 29, 31. Lead 29 is connected to shield 21, while lead 31 is connected to a metal part of reel 17, which in turn is essentially grounded to the earth, indicated by numeral 33, through the tractor 11 or other supportive apparatus. The resistance between shield 21 and ground 33 serves as a fourth leg of a bridge circuit.

The right side of the bridge circuit contains two resistors 35, 37 of 22 meg (22,000,000) ohm resistance. Resistors 35, 37 are in series between the voltage from the fixed voltage source, indicated as VF, and the circuit ground 39. The third leg comprises two resistors 41, 43 of 80 K (80,000) ohm and 500 K ohm value respectively, connected in parallel with one end to circuit ground 39. The other side of resistors 41, 43 is connected to a switch 45, which places either one or the other in contact with lead 31 and earth ground 33. This changes the sensitivity of the detection circuit from high sensitivity with resistor 43 to lower sensitivity with resistor 41. Circuit ground 39 is not directly contacted with earth ground 33 at any point, but is separated from it by resistor 41 or 43.

The junction between resistors 35, 37 is connected to an amplifier 47, and the junction between test lead 31 and resistors 41, 43 is connected to an amplifier 49. The outputs of buffer amplifiers 47, 49 are connected to a differential amplifier 51.

In operation, a constant value voltage will be present at amplifier 47 due to the small amount of current flowing through resistors 35, 37 from the fixed voltage source to the circuit ground 39. Amplifier 49 will normally have no voltage at its input since the resistance from shield 21 to ground 33 approaches infinity. The outputs of amplifiers 47, 49 have been previously adjusted to be equal when the input to amplifier 49 is essentially zero. When differential amplifier 51 receives two essentially equal inputs, it will not provide an output.

If a fault occurs, as indicated by numeral 53, the resistance from shield 21 to ground 33 will drop depending on the severity of the fault. This provides a voltage potential at the input of amplifier 49. The outputs of amplifiers 47, 49 will consequently differ, causing differential amplifier 51 to provide an output proportional to that difference. This output causes a transmitter to send a signal to a remote receiver, which in turn sounds an alarm. The receiver may be on the tractor near the operator, or carried by a supervisor or inspector nearby, as indicated by numeral 55.

The detection circuit, shown in more detail in FIG. 3 includes circuit protection means comprising a 510 K ohm resistor 60 and capacitor 61, connected in the circuit after switch 57. Capacitor 61 is connected to circuit ground 39, and resistor 59 is connected in series before the junction of resistor 35 and lead 29. Capacitor 61 discharges to circuit ground through resistor 60. A constant, temperature stable voltage is provided to the bridge circuit by two diodes 63, 65 and a Zener diode 67. These diodes are connected 67 to ground after resistor 59 and before the junction of lead 29 and resistor 35. Resistors 41, 43 have capacitors 69, 71 in parallel with them to absorb any residual voltage in the cable shield present prior to connection with the detecting circuit. The capacitors also serve to prevent the cable from acting as an antenna if radio frequency voltages are nearby in sufficient strength to trigger the alarm. Capacitors 69, 71 are sized to provide in combination with resistors 41, 43 approximately a one second time constant. The battery is designated Vb.

Resistors 73, 75 of 10 K ohm value are connected between the outputs of amplifiers 49, 47 and the inputs of differential amplifier 51. A potentiometer 77 with maximum resistance of 250k ohm is connected after resistor 75 to ground, and is used to null any output differences between amplifiers 47, 49 to zero when the input voltage to amplifier 49 is zero. A feedback loop exists between the output of the differential amplifier 51 and the inverting (−) input of the same amplifier. The feedback loop contains a 47 k ohm resistor 79 and a potentiometer 81 with a maximum value of 100k ohms. These feedback resistors control the amount of voltage gain differential amplifier 51 gives to an input voltage difference. For a fixed amount of voltage difference at the inputs of differential amplifier 51, potentiometer 81 can be adjusted to provide more or less output voltage in proportion to that fixed difference. For example: If the difference between (−) and (+) of 51 is 10. millivolts (0.010 volt), the output of 51 might be 1.0 volt. The gain of amplifier 51 would then be 100, or 1.0 volt divided by 0.010 volt. This gain could be changed by adjusting potentiometer 81 with no change in the inputs of 51.

A sustaining means is provided for continuing to provide an output to the alarm circuit means even though the inputs to the differential amplifier again return to an equal state. The sustaining means comprises the element 85 and is connected between the differential amplifier means and transmitter. Silicon control rectifier or thyristor 85 has its gate connected to a protective diode 84, which in turn is connected to the output side of potentiometer 83. The anode is connected to the transmitter, and the cathode to circuit ground 39. A 1 K ohm resistor 87 is connected between the gate and cathode to prevent false triggering. A 10 k ohm resistor 89 is connected in parallel across the transmitter. Once an output from the differential amplifier 51 with sufficient magnitude to turn on the thyristor 85 is produced, the thyristor will continue to conduct until the battery switch 57 is switched off.

The transmitter, which is located in the same box with the detecting circuit, may be of a conventional nature with range as necessary to signal its companion receiver. Preferably protection measures are taken in the transmitting signal and receiver to screen out other transmissions, including frequency shift keyed modulation and digital encoding techniques. The alarm may be visual and audible and is of conventional circuitry. In the preferred embodiments with switch 45 in contact with resistor 41, the alarm will sound if the resistance from shield 21 to earth ground 33 drops to 80,000 ohm.

It should be appreciated that an invention with significant advantages has been provided. The detecting circuit is of a solid state electronic construction, requiring no components such as relays that are sensitive to climate and vibration. The entire detecting circuit, with battery and transmitter, is mounted directly on the reel, eliminating the need for a collector. No adjustments are required for varying field conditions.

While a metal reel has been described, a wooden reel with a conductive plate and hub can be employed.

Also, various configurations of apparatus, such as tractor and trailer combinations with electrically conductive interconnecting hitches, could be employed instead of the crawler tractor illustrated in FIG. 1.

This invention is useful in other applications where conductors may not be individually insulated.

While the invention has been shown in only one of its forms, it should be apparent to those skilled in the art that it is not so limited but is susceptible to various changes and modifications without departing from the spirit thereof.

I claim:

1. An apparatus for use with machinery for laying insulating cable, for detecting if the cable insulation is damaged while the cable is being laid, comprising:
    (a) a detection circuit mounted to the cable end, comprising:
        a bridge circuit means connected between the cable and the reel for providing two outputs of different values should the resistance of the cable with respect to the reel drop below a selected minimum; and
        differential amplifier means for receiving the outputs from the bridge circuit means and for providing an output if the outputs differ in value by a selected minimum amount; and
    (b) alarm means responsively sensitive to said detection circuit for providing an alarm signal if the output of the differential amplifier means reaches a selected minimum; the bridge circuit means comprising:
        a first resistor connected to a constant value electrical potential source;
        a first amplifier having an input connected to the first resistor on the side opposite the electrical potential source;
        a second resistor connected between the input of the first amplifier and a circuit ground, thereby providing an electrical potential of constant value at the input of the first amplifier;

a third resistor connected between the circuit ground and grounded to the reel, which in turn is grounded to the earth;

a second amplifier having an input grounded to the reel;

a lead extending from the electrical potential source to the cable, thereby providing an electrical potential at the input of the first amplifier if a finite resistance exists between the cable and the reel, the outputs of the first and second amplifier being connected to the differential amplifier means and being adjusted so as to be equal if the input at the second amplifier is substantially zero.

2. An apparatus for use with machinery for laying insulating cable, for detecting if the cable insulation is damaged while the cable is being laid, comprising:

(a) a detection circuit mounted to the cable end, comprising:

a first resistor connected to a constant value electrical potential source;

a first amplifier having an input connected to the first resistor on the side opposite the electrical potential source;

a second resistor connected between the input of the first amplifier and a circuit ground, thereby providing an electrical potential of constant value at the input of the first amplifier;

a third resistor connected between the circuit ground and grounded to the reel, which in turn is grounded to the earth;

a second amplifier having an input grounded to the reel;

a lead extending from the electrical potential source to the cable, thereby providing an electrical potential at the input of the first amplifier only if a finite resistance exists between the cable and the reel; and differential amplifier means connected to the outputs of the first and second amplifiers, for providing an output should the input received from the first and second amplifier differ, the output of the first and second amplifiers being adjusted so as to be equal if the input at the second amplifier is substantially zero; and (b) alarm means responsively sensitive to said detection circuit for providing an alarm signal if the output of the differential amplifier means reaches a selected minimum.

3. The apparatus according to claim 2 further comprising:

sustaining means for continuing to provide an output to the alarm circuit means even though the inputs to the differential amplifier means return to equal state.

4. The apparatus according to claim 3 wherein the sustaining means comprises:

a thyristor having its gate connected to the differential amplifier means, its anode connected to an electrical potential through a transmitter, and its cathode to the circuit ground.

5. The apparatus according to claim 2 wherein the alarm circuit means comprises:

transmitter means, connected to the detection circuit, for transmitting an alarm signal to a receiver at a remote location.

6. The apparatus according to claim 2 further comprising:

a fourth resistor in parallel with the third resistor and being of a different value than the third resistor, and switch means connected with the third and fourth resistors for selectively placing one of the third and the fourth resistors between the circuit ground and the first amplifier.

7. The apparatus according to claim 2 wherein the cable is of a type having insulating conductors, a metallic shield surrounding a bundle of the conductors, and outer insulation surrounding the shield, and wherein the shield is connected to the electrical potential source.

8. The apparatus according to claim 2 wherein the detecting circuit is mounted physically on the reel.

* * * * *